(12) United States Patent
Chen et al.

(10) Patent No.: US 6,577,656 B2
(45) Date of Patent: Jun. 10, 2003

(54) SYSTEM AND METHOD OF PACKAGING A LASER/DETECTOR

(75) Inventors: John Ming-wei Chen, Rowland Height, CA (US); Robert K. Shih, Arcadia, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 09/923,471

(22) Filed: Aug. 6, 2001

(65) Prior Publication Data

US 2002/0131460 A1 Sep. 19, 2002

Related U.S. Application Data

(60) Provisional application No. 60/275,402, filed on Mar. 13, 2001.

(51) Int. Cl.[7] .................................................. H01S 3/04
(52) U.S. Cl. ............................. 372/36; 372/36; 372/33
(58) Field of Search ........................... 372/108, 33, 36; 257/99; 237/787; 385/92, 93, 88, 89

(56) References Cited

U.S. PATENT DOCUMENTS

| | | | |
|---|---|---|---|
| 4,877,756 A | | 10/1989 | Yamamoto et al. |
| 5,068,866 A | * | 11/1991 | Wada et al. ................... 372/36 |
| 5,218,611 A | * | 6/1993 | Tanaka et al. ............... 372/108 |
| 5,485,479 A | * | 1/1996 | Kitamura et al. ............ 257/787 |
| 5,764,675 A | * | 6/1998 | Juhala .......................... 257/99 |
| 6,111,903 A | * | 8/2000 | Isaksson et al. ............... 372/33 |
| 6,181,720 B1 | * | 1/2001 | Kanemoto et al. ............ 372/36 |

* cited by examiner

Primary Examiner—Paul Ip
Assistant Examiner—Hung T Vy
(74) Attorney, Agent, or Firm—Pennie & Edmonds LLP

(57) ABSTRACT

The present invention relates generally to laser/detector packages, and particularly to laser/detector packages with components that increase the accuracy and ease of laser diode positioning. In particular, the laser/detector package of the present invention includes an attachment plate having a reference surface; a header post that is perpendicular to the reference surface when attached to the reference surface; sub-mount that houses a laser diode and abuts the reference surface or a spacer, which abuts the reference surface. By abutting the reference surface or the spacer, the laser diode attached to the sub-mount is easily and precisely positioned a proper distance from the reference surface. Additionally, preferred embodiments of the invention include a marking on the sub-mount that is parallel to the reference surface and a marking that is perpendicular to the reference surface on the spacer or sub-mount. These markings further improve the ease and accuracy of positioning and repositioning the laser diode and/or sub-mount.

63 Claims, 6 Drawing Sheets

SYSTEM AND METHOD OF PACKAGING A LASER/DETECTOR

This application claim the benefit of Provisional Application No. 60/275,402 filed Mar. 13, 2001.

The present invention relates generally to laser/detector packages, and particularly to laser/detector packages with components that increase the accuracy of positioning components of a laser/detector package.

BACKGROUND OF THE INVENTION

A prior art laser/detector package is illustrated in FIG. 1. Laser diode 7 and sensitive photo diode 9 ("SPD") are attached to circular attachment plate 1. In particular, laser diode 7 is attached to sub-mount 8, which is attached to header post 6. Also included is cap 4, which has laser light transparent window 5 and is attached to circular attachment plate 1. Attached to cap 4 is window 5. Header post 6, which functions as a heat sink, is provided on the portion of circular attachment plate 1 covered by cap 4. Semiconductor laser chip 7 is coupled to cathode terminal 2 and anode terminal 12 and SPD 9 is coupled to anode terminal 3. Typically, wires 11 connect semiconductor laser chip 7 to cathode terminal 2 and SPD chip 9 to anode terminal 3.

A drawback of prior art laser/detector packages includes the positioning of laser diode 7 on sub-mount 8. In these systems, the sub-mount is positioned by reference to the top of header post 6. However, header posts 6 are not manufactured with enough accuracy to reliably ensure that laser diode 7, which is mounted on sub-mount 8, is a proper distance from circular attachment plate 1.

Additionally, a reflow sub-process included in various stages of the manufacturing process often causes laser diode 7 and sub-mount 8 to move from their initial position. The reflow sub-process includes placing a laser/detector package in a furnace to reflow solder used to bind laser diode 7 to sub-mount 8 and sub-mount 8 to header plate 6.

When laser diode 7 and sub-mount 8 move from their initial position during the reflow sub-process, the laser/detector package is discarded because there is no accurate way to reposition these components.

SUMMARY OF THE INVENTION

There is needed in the art therefore a system and method for manufacturing laser/detector packages that enables a more accurate manufacturing process. In particular, a system and method by which precise positioning of laser/detector package components is possible, movement of laser/detector package components during a reflow sub-process is minimized, and laser/detector package components that do move during a reflow sub-process may be accurately repositioned.

One embodiment of the invention is a laser/detector package comprising an attachment plate having a reference surface; a header post that is perpendicular to the reference surface; a spacer that abuts the reference surface when attached to the header post; a sub-mount that abuts the spacer when attached to the header post; and a laser diode attached to the sub-mount.

Additionally, preferred embodiments of the invention include on the spacer a marking that is perpendicular to the reference surface. This marking permits a more precise and easier positioning and repositioning of the sub-mount and laser diode. A line that is an inherent part of the laser diode and also perpendicular to the reference surface is aligned with the marking.

Further, preferred embodiments of the invention include on the sub-mount a marking that is parallel to the reference surface when the sub-mount is attached to header post. When positioning the laser diode on the sub-mount, the laser diode is positioned such that it abuts the marking on the sub-mount.

In another embodiment of the invention, the laser/detector package comprises an attachment plate having a reference surface; a header post that is perpendicular to the reference surface; a sub-mount that abuts the reference surface when attached to the header post; and a laser diode attached to the sub-mount. Instead of including a separate spacer as in the above described embodiment, the size of the sub-mount is increased so that the laser diode is a proper distance from the reference surface when the sub-mount abuts the reference surface.

Further, preferred embodiments of the invention include on the sub-mount a marking that is parallel to the reference surface and a marking that is perpendicular to the reference surface when the sub-mount is attached to header post. The laser diode is positioned on the sub-mount such that an edge of the laser diode abuts the marking parallel to the reference surface and a line on the laser diode aligns with the marking perpendicular to the reference surface.

Another aspect of the invention includes a method of assembling a laser/detector package that comprises attaching a spacer to the header post so that the spacer abuts the reference surface of the attachment plate; attaching a laser diode to the sub-mount so that the laser diode emits laser beams in a direction parallel to the sub-mount; and attaching the sub-mount to the header post so that the sub-mount abuts the spacer.

Additionally, preferred embodiments of the invention include a) marking the spacer so that the spacer includes a mark that is perpendicular to the reference surface and b) positioning the laser diode with reference to the mark.

Further, preferred embodiments of the invention include marking the sub-mount so that the sub-mount includes a mark that is parallel to the reference surface. When positioning the laser diode on the sub-mount, this mark serves as a guideline to ensure that the laser diode is a precise distance from the circular attachment plate.

Another method of assembling a laser/detector package comprises attaching a laser diode to the sub-mount so that the laser diode emits laser beams in a direction parallel to the front surface of the sub-mount and attaching the sub-mount to the header post so that the sub-mount abuts the reference surface of the attachment plate.

Further, preferred embodiments of the invention include marking the sub-mount so that the sub-mount includes a mark that is parallel to the reference surface and a mark that is perpendicular to the reference surface. When positioning the laser diode on the sub-mount, these marks serve as guidelines to ensure precise positioning of the laser diode.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
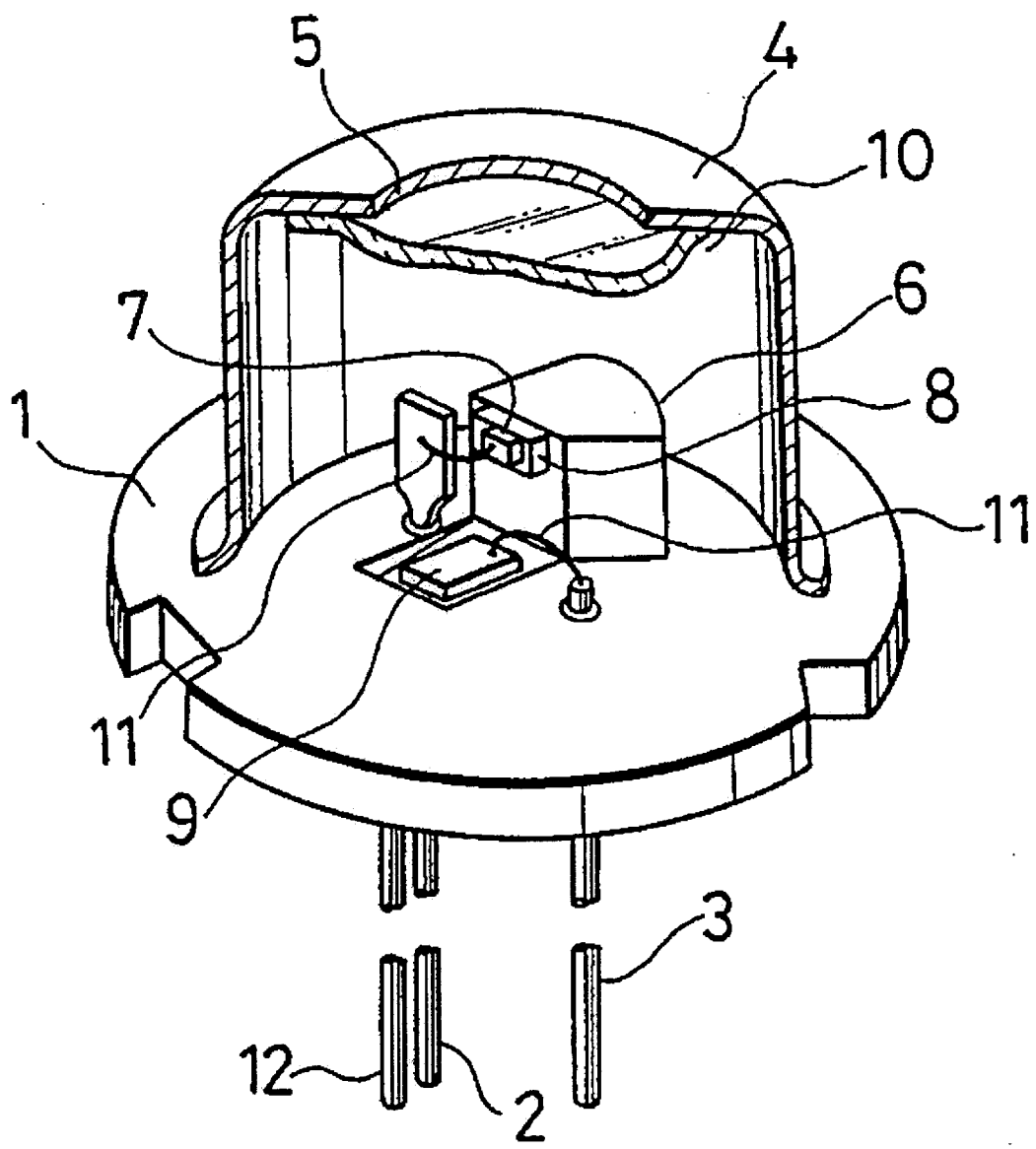
FIG. 1 is a perspective view showing a prior art laser/detector package partially broken away.
Figure 2:
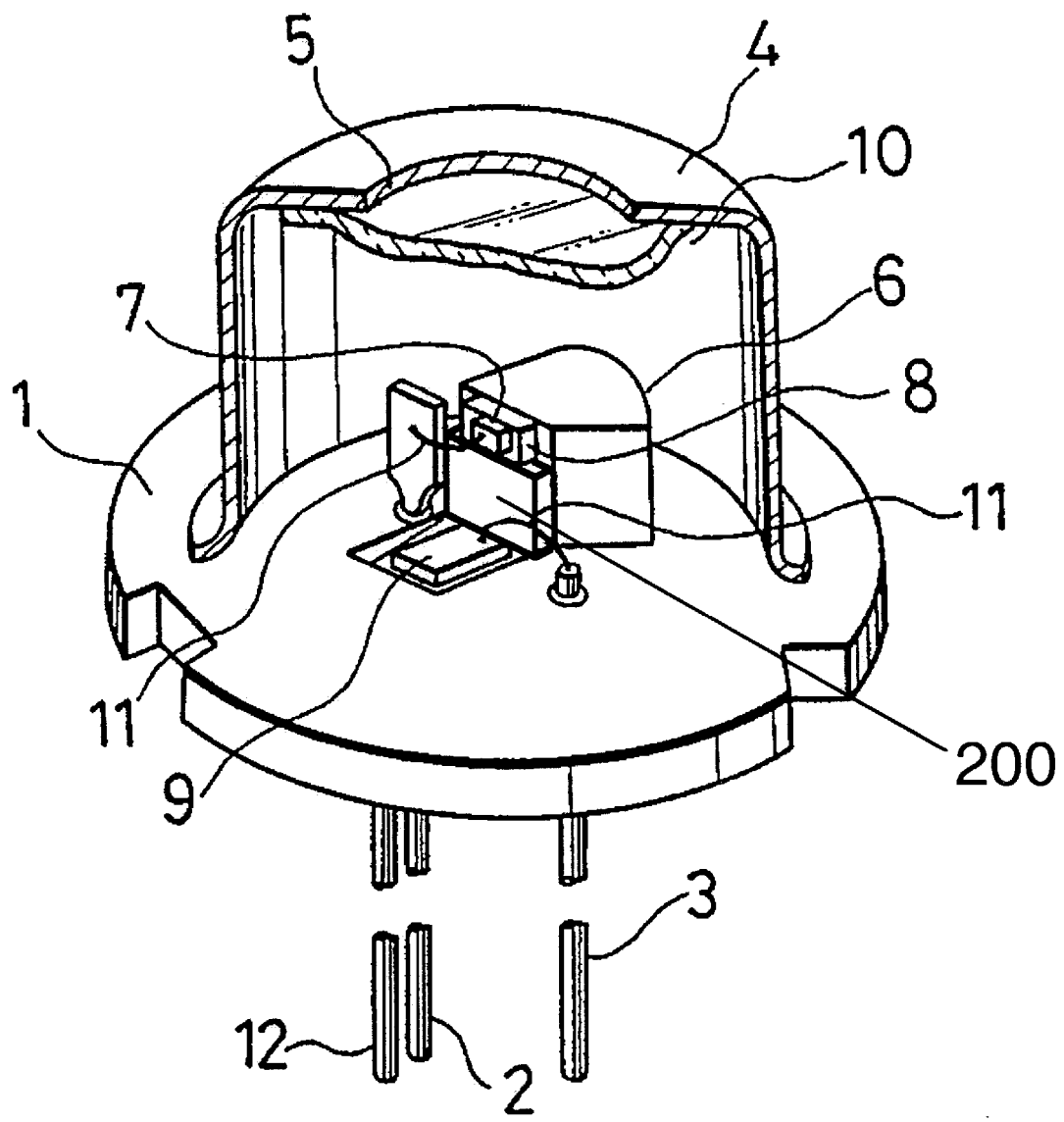
FIG. 2 is a perspective view showing a laser/detector package, which is partially broken away, according to an embodiment of the present invention.

A laser/detector package manufactured in accordance with an embodiment of the present invention is illustrated in FIG. 2. Laser diode 7 and sensitive photo diode 9 ("SPD") are attached to circular attachment plate 1. Laser diode 7 emits laser beams in two directions. One beam is emitted from laser diode 7 directly to SPD 9, which captures the beam for analysis. In particular, this beam provides information about the second laser beam, which is emitted from laser diode 7 in the opposite direction of the first beam. In other words, in a direction away from SPD 9 that is roughly perpendicular to circular attachment plate 1.

Also included in FIG. 2 is cap 4, which has laser light transparent window 5 and is attached to circular attachment plate 1. Attached to cap 4 is window 5. Header post 6 is provided on the portion of circular attachment plate 1 covered by cap 4. Semiconductor laser chip 7 is connected to cathode terminal 2 and anode terminal 12 and SPD 9 is connected to anode terminal 3 by wires 11. Additionally, wires 11 also connect SPD chip 9 to anode terminal 3.

Also included in FIG. 2 is spacer 200. Spacer 200 is attached to header post 6 by silver epoxy. Spacer 200 ensures that sub-mount 8 is a precise distance from reference surface 330 of circular attachment plate 1, which is the flat surface to which cap 4 is attached as illustrated in FIG. 2.

More specifically, laser diode 7 is attached to sub-mount 8, which is soldered to header post 6. Header post 6 functions as a heat sink for laser diode 7. Sub-mount 8 comprises silicon, so sub-mount 8 electrically isolates laser diode 7 from header post 6, but does not prevent header post 6 from absorbing heat from laser diode 7.

Figure 3:
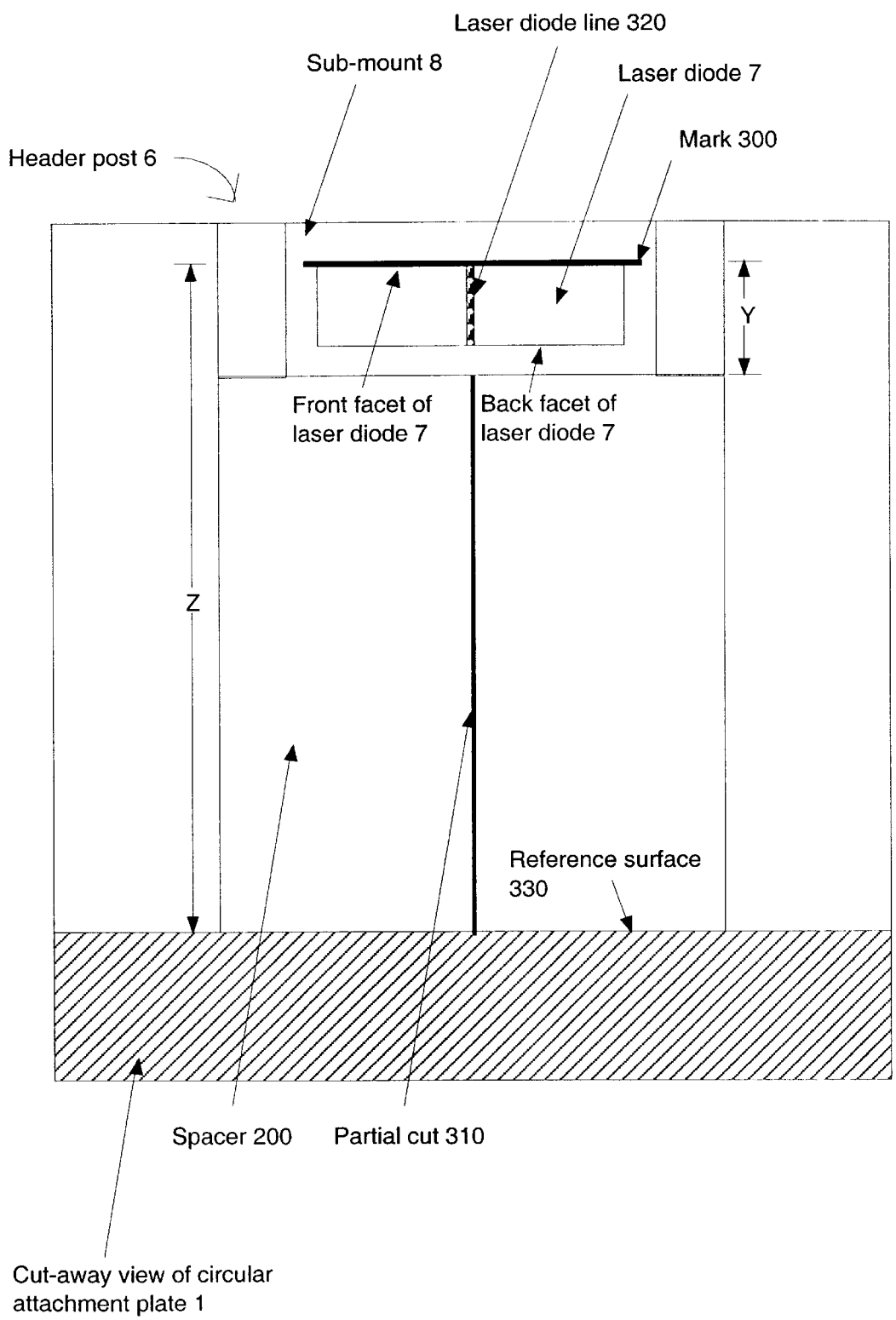
FIG. 3 illustrates various components of a variation of the embodiment of the present invention illustrated in FIG. 2.

In preferred embodiments, sub-mount 8 is marked before attaching laser diode 7 to sub-mount 8 as illustrated in FIG. 3. Mark 300 is positioned a precise distance from the edge of sub-mount 8 that abuts spacer 200 (distance Y of FIG. 3). After attaching sub-mount 8 to header post 6, mark 300 is parallel with reference surface 330 of circular attachment plate 1. An edge of laser diode 7 is positioned along mark 300 when attaching laser diode 7 to sub-mount 8. By controlling the size of the spacer 200 and the distance of mark 300 from the edge of sub-mount 8, the distance of laser diode 7 from reference surface 330 of circular attachment plate 1 (distance Z of FIG. 3) is precisely controlled without using header post 6 as a positioning reference.

Mark 300 also permits accurate repositioning of laser diode 7 after subjecting the laser/detector package to a reflow sub-process during a stage of the manufacturing process. Without mark 300, accurate repositioning of laser diode 7 is not feasible because there would be no reliable guideline by which to reposition laser diode 7.

Mark 300 is preferably a metal pattern created by a photolithography process. Briefly, photolithography involves imprinting a pattern on silicon that is coated with a photoresist mask containing the pattern and spinning ultraviolet light through the mask. However, mark 300 can be created using other means without departing from the scope of the present invention. In a preferred embodiment, mark 300 indicates the position of the front facet of laser diode 7. In an alternative embodiment, mark 300 can indicate the position of the back facet of laser diode 7.

As noted above, the reflow sub-process can also cause sub-mount 8 to move from its initial position, but spacer 200 minimizes movement of sub-mount 8 and the silver epoxy prevents movement of spacer 200. Again, sub-mount 8 is attached to header post 6 so that it abuts spacer 200, which abuts reference surface 330 of circular attachment plate 1.

In preferred embodiments, spacer 200 is marked as illustrated in FIG. 3. Partial cut 310 is usually positioned along the axis of spacer 200 that is perpendicular to circular attachment plate 1. Laser diode line 320, which is also illustrated in FIG. 3, is aligned with partial cut 310 in order to precisely position laser diode 7 and sub-mount 8 (to which laser diode 7 is attached).

Partial cut 310, which is preferably created by a dicing saw, also permits repositioning of laser diode 7 and/or sub-mount 8 after subjecting the laser/detector package to a reflow sub-process during a stage of the manufacturing process. Without partial cut 310, accurate repositioning of laser diode 7 and/or sub-mount 8 is not feasible because there would be no reliable guideline by which to position laser diode 7 and/or sub-mount 8.

Laser diode line 320 is an inherent feature in laser diodes suitable for use in the present invention. In terms of horizontal positioning with reference to circular attachment plate 1, it is laser diode line 320 that is critical rather than the edges of laser diode 7. The reason is that the laser beams emitted by laser diode 7 emanate from the area of laser diode line 320.

Figures 4, 6:
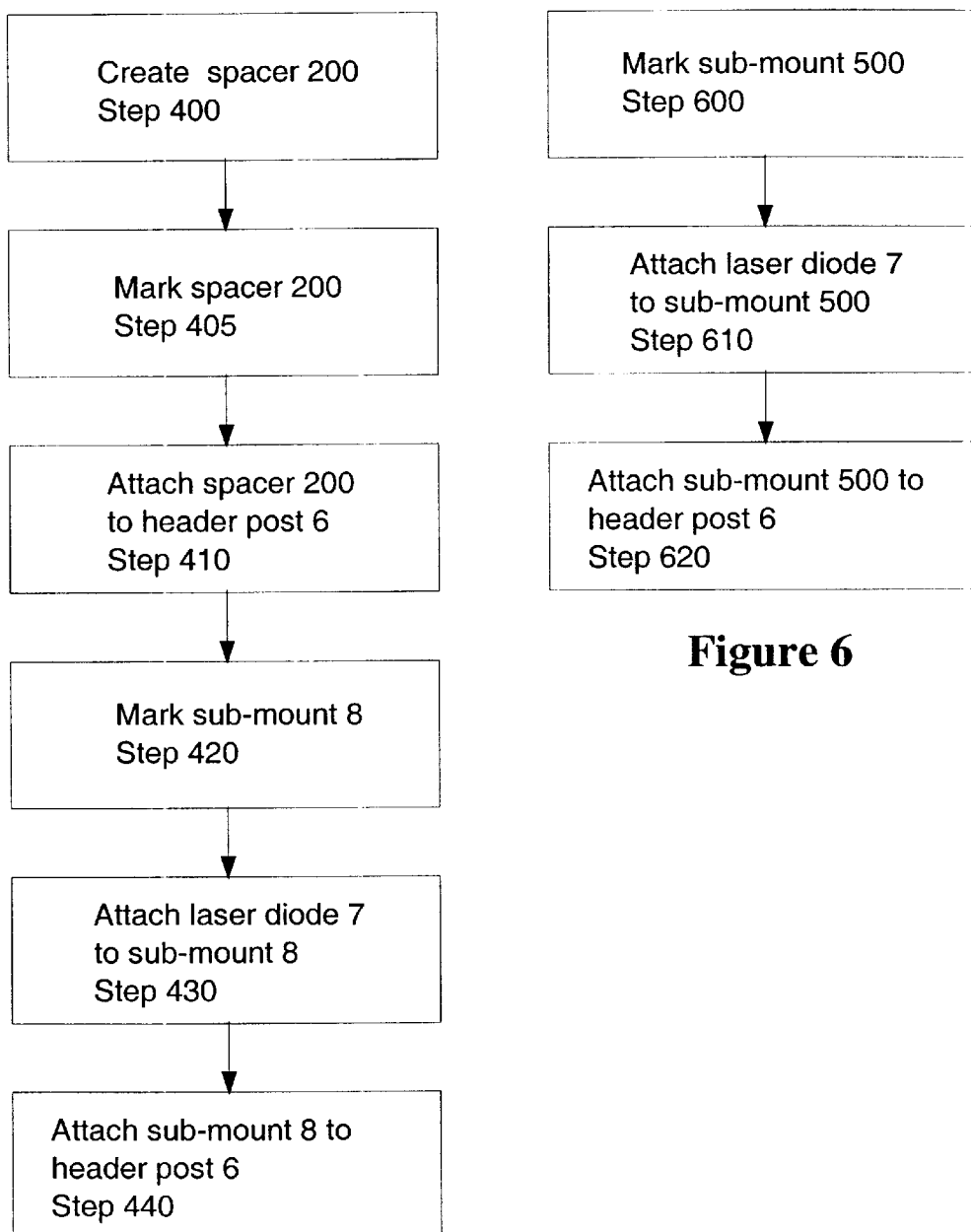
FIG. 4 illustrates steps used in a preferred embodiment of the invention to construct a laser/detector package.
FIG. 6 illustrates steps used in a preferred embodiment of the invention to construct a laser/detector package.

A method for manufacturing a laser/detector package that is consistent with the embodiment illustrated in FIG. 2 and that includes marking sub-mount 8 and spacer 200 is illustrated in FIG. 4. The process begins with creating spacer 200 with a precisely measured height (step 400). This may be accomplished using a dicing saw.

Next, spacer 200 is marked with a vertical line to create partial cut 310 (step 405). As described above, partial cut 310 is preferably created with a dicing saw. Partial cut 310 permits precise positioning of laser diode 7 and/or sub-mount 8. In alternative embodiments, a vertical line may be made on spacer 200 using other techniques such as photolithography or using a cutting tool other than a dicing saw.

The marked spacer 200 is then attached to header post 6 using a silver epoxy (step 410).

Additionally, sub-mount 8 is marked (step 420) to create mark 300. As described above, mark 300 is preferably created by photolithography. The distance of mark 300 from the edge of sub-mount 8 that abuts spacer 200 (distance Y of FIG. 3) is dictated by the size of spacer 200 and the precise distance that the front facet of laser diode 7 must be from reference surface 330 of circular attachment plate 1 (distance Z of FIG. 3). Again, mark 300 permits precise positioning of laser diode 7 on sub-mount 8. Importantly, mark 300 is not affected by the reflow process described above. Similarly, the size and shape of spacer 200 and sub-mount 8 are not affected by the reflow process. Accordingly, mark 300 and partial cut 310 remain viable means for repositioning sub-mount 8 and laser diode 7 after a reflow process.

After sub-mount 8 is marked, laser diode 7 is positioned on sub-mount 8 so that laser diode 7 abuts mark 300. Thus, a plane of laser diode 7 is parallel with mark 300, spacer 200, and reference surface 330 of circular attachment plate 1.

More specifically, solder paste is applied to sub-mount 8 and then laser diode 7 is positioned on sub-mount 8 using placement equipment (e.g., pick-and-place machines, chip shooters, etc.). The laser/detector package is then subjected to a reflow sub-process, which includes heating the laser/detector package until the solder paste is liquidus. The laser/detector package is then cooled until the solder hardens and creates a permanent connection between laser diode 7 and sub-mount 8. Before the solder cools however, laser diode 7 is repositioned as needed by reference to mark 300—thus completing step 430.

Sub-mount 8 is then positioned on header post 6 by reference to partial cut 310. Specifically, sub-mount 8 is positioned on header post 6 so that laser diode line 320 is aligned with partial cut 310. Additionally, sub-mount 8 is positioned on header post 6 so that the bottom surface of sub-mount 8, the surface facing reference surface 330 of circular attachment plate 1, abuts the top surface of spacer 200. Further, the laser/detector package is subjected to another reflow sub-process, as described above in detail. As with laser diode 7, sub-mount 8 is repositioned as necessary after the reflow process—thus completing step 440.

Laser diode 7 need not be repositioned after the reflow sub-process in step 440 because the solder (e.g., gold and tin solder) used to attach laser diode 7 to sub-mount 8 has a higher melting temperature than the solder (e.g., lead and tin solder) used to attach sub-mount 8 to header post 6.

Figure 5:
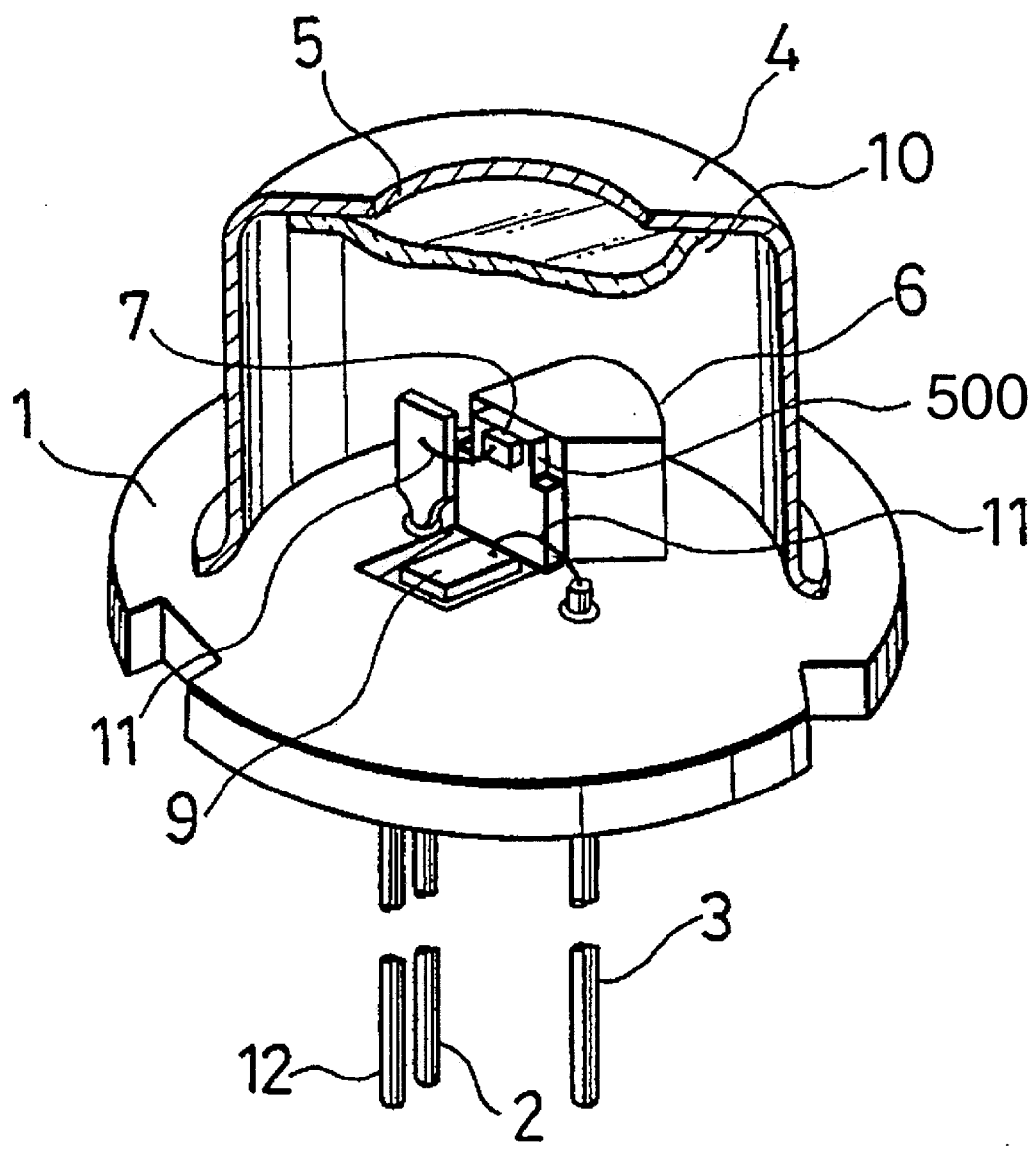
FIG. 5 is a perspective view showing a laser/detector package, which is partially broken away, according to another embodiment of the present invention.

A laser/detector package manufactured in accordance with another embodiment of the present invention is illustrated in FIG. 5. Laser diode 7 and sensitive photo diode 9 ("SPD") are attached to circular attachment plate 1. Laser diode 7 emits a laser beam towards SPD 9 and away from SPD 9 in a direction roughly perpendicular to circular attachment plate 1.

Also included in FIG. 5 is cap 4, which has laser light transparent window 5 and is attached to circular attachment plate 1. Attached to cap 4 is window 5. Header post 6 is provided on the portion of circular attachment plate 1 covered by cap 4. Semiconductor laser chip 7 is connected to cathode terminal 2 and anode terminal 12 and SPD 9 is connected to anode terminal 3 by wires 11. Additionally, wires 11 also connect SPD chip 9 to anode terminal 3.

More specifically, laser diode 7 is attached to enlarged sub-mount 500, which is soldered to header post 6. Header post 6 functions as a heat sink for laser diode 7. Sub-mount 500 comprises silicon, so sub-mount 500 electrically isolates laser diode 7 from header post 6, but does not prevent header post 6 from absorbing heat from laser diode 7.

Figure 7:
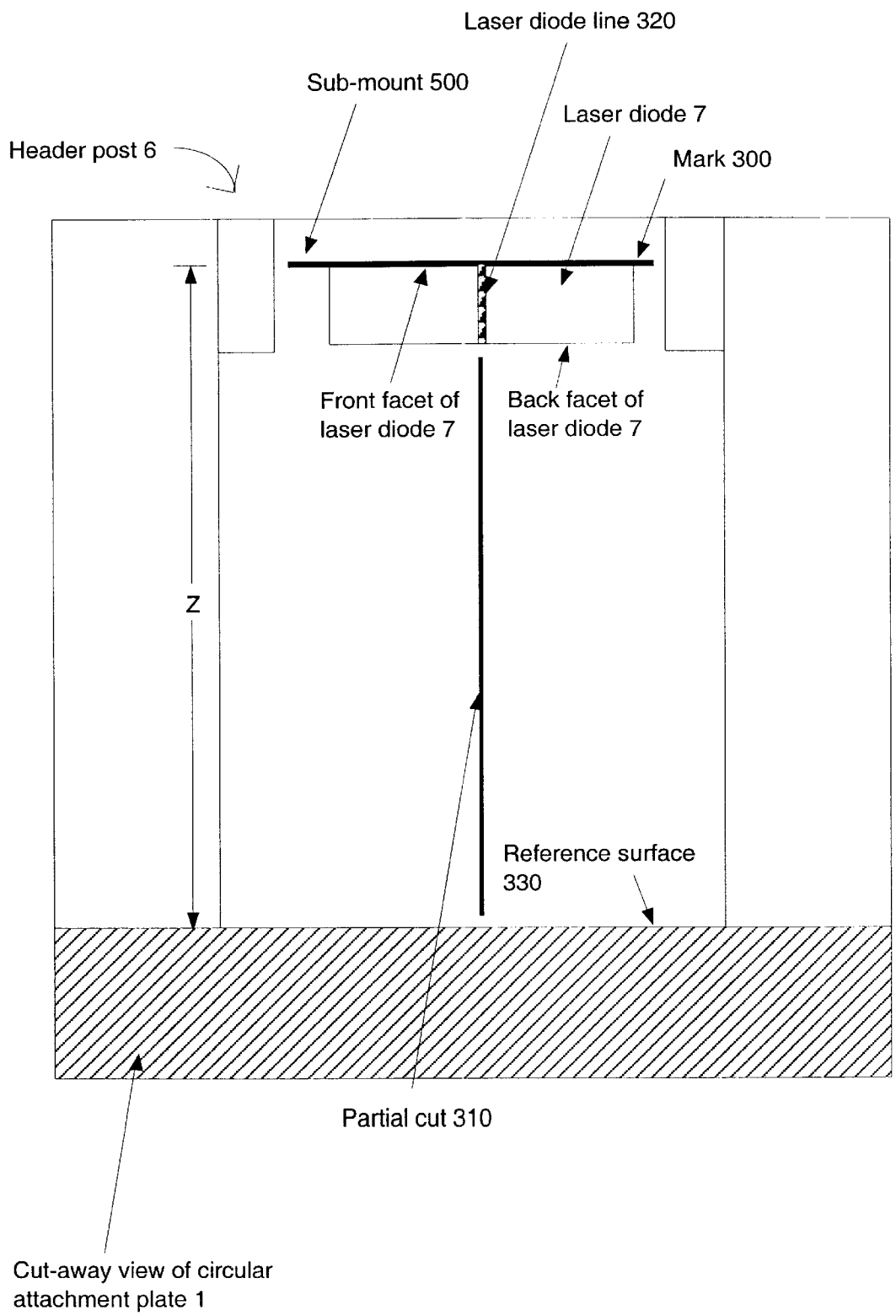
FIG. 7 illustrates various components of a variation of the embodiment of the present invention illustrated in FIG. 5.

Additionally, sub-mount 500 is sized to precisely position laser diode 7 a predetermined distance from reference surface 330 of circular attachment plate 1, with a bottom surface of sub-mount 500 abutting reference surface 330 of circular attachment plate 1. FIG. 7 better illustrates a sub-mount 500 consistent with this embodiment of the invention.

In preferred embodiments, sub-mount 500 is marked before attaching laser diode 7 to sub-mount 500 as illustrated in FIG. 7. Mark 300 is positioned a precise distance from the edge of sub-mount 500 (distance Z in FIG. 7) that abuts reference surface 330 of circular attachment plate 1. After attaching sub-mount 500 to header post 6, mark 300 is parallel with reference surface 330 of circular attachment plate 1. The front facet edge of laser diode 7 is positioned along mark 300. Thus, by controlling the distance of mark 300 from the edge of sub-mount 500 that abuts circular attachment plate 1, the distance of the front facet of laser diode 7 from reference surface 330 of circular attachment plate 1 is precisely controlled without relying on header post 6 as a positioning reference. In alternative embodiments, a vertical line may be made on sub-mount 500 using other techniques such as photolithography or using a cutting tool other than a dicing saw.

Mark 300 also permits repositioning of laser diode 7 after subjecting the laser/detector package to a reflow sub-process during the manufacturing process. Without mark 300, accurate repositioning of laser diode 7 is not feasible because there is no reliable guideline by which to reposition laser diode 7. The mark is preferably created by a photolithography process as described above.

As noted above, the reflow sub-process can also cause sub-mount 500 to move from its initial position, but abutting sub-mount 500 against reference surface 330 of circular attachment plate 1 minimizes movement of sub-mount 500.

In preferred embodiments, sub-mount 500 is also partially cut to create partial cut 310 as illustrated in FIG. 7. Partial cut 310 is usually positioned along the axis of sub-mount 500 that is perpendicular to circular attachment plate 1. Laser diode line 320, which is also illustrated in FIG. 7, is aligned with partial cut 310 in order to precisely position laser diode 7 on sub-mount 500.

Partial cut 310, which is preferably created by a dicing saw, also permits repositioning of laser diode 7 after subjecting the laser/detector package to a reflow sub-process during a stage of the manufacturing process.

As noted above, laser diode line 320 is an inherent feature in laser diodes suitable for use in the present invention.

A method for manufacturing a laser/detector package that is consistent with the embodiment illustrated in FIG. 5 and that includes marking sub-mount 500 is illustrated in FIG. 6. The claimed process begins making partial cut 310 with a dicing saw on sub-mount 500 and creating mark 300 on sub-mount 500 with a photolithography process (step 600). Again, partial cut 310 and mark 300 permit precise positioning of laser diode 7 on sub-mount 500.

After sub-mount 500 is marked, laser diode 7 is positioned on sub-mount 500 so that laser diode 7 abuts mark 300 and laser diode line 320 aligns with partial cut 310.

More specifically, solder paste is applied to sub-mount 500 and then laser diode 7 is positioned on sub-mount 500 using placement equipment (e.g., pick-and-place machines, chip shooters, etc.). The laser/detector package is then subjected to a reflow sub-process, which includes heating the laser/detector package until the solder paste is liquidus. The laser/detector package is then cooled until the solder hardens and creates a permanent connection between laser diode 7 and sub-mount 500. Before the solder cools however, laser diode 7 is repositioned as needed by reference to mark 300 and partial cut 310—thus completing step 610.

Sub-mount 500 is then positioned on header post 6. Specifically, sub-mount 500 is positioned on header post 6 so that the bottom surface of sub-mount 500 abuts reference surface 330 of circular attachment plate 1. Additionally, the laser/detector package is subjected to another reflow sub-process, as described above in detail—thus completing step 620.

Laser diode 7 need not be repositioned after the reflow sub-process in step 620 because the solder used to attach laser diode 7 to sub-mount 500 has a higher melting temperature than the solder used to attach sub-mount 500 to header post 6.

What is claimed is:

1. A laser/detector package comprising:

an attachment plate having a reference surface;

a header post having a front surface that is perpendicular to the reference surface;

a spacer having a front surface, a top surface, a bottom surface, and a back surface attached to the front surface of the header post such that the bottom surface of the spacer abuts the reference surface;

a sub-mount having a front surface, a bottom surface, and a back surface attached to the front surface of the header post at a position above the spacer such that the bottom surface of the sub-mount abuts the top surface of the spacer, the spacer configured to maintain a precise distance between the reference surface and the sub-mount; and a laser diode attached to the front surface of the sub-mount, said front surface facing away from the reference surface;

wherein the spacer and sub-mount are configured to maintain a predefined distance between the laser diode and the reference surface.

2. The laser/detector package of claim 1, wherein the sub-mount is comprised of silicon.

3. The laser/detector package of claim 1, wherein solder attaches the sub-mount to the header post.

4. The laser/detector package of claim 3, wherein the solder comprises lead and tin solder.

5. The laser/detector package of claim 1, wherein solder attaches the laser diode to the sub-mount.

6. The laser/detector package of claim 5, wherein the solder comprises gold and tin solder.

7. The laser/detector package of claim 1, wherein silver epoxy attaches the spacer to the header post.

8. The laser/detector package of claim 1, wherein the front surface of the spacer has a mark that runs in a direction perpendicular to the reference surface, the mark facilitating positioning of the sub-mount.

9. The laser/detector package of claim 8, wherein a center stripe on the laser diode is aligned with the mark.

10. The laser/detector package of claim 8, wherein the mark is a partial cut of the front surface of the spacer.

11. The laser/detector package of claim 8, wherein the mark is a metal pattern on the front surface of the spacer.

12. The laser/detector package of claim 1, wherein the front surface of the sub-mount has a mark that runs in a direction parallel to the reference surface, the mark facilitating positioning of the laser diode.

13. The laser/detector package of claim 12, wherein an edge of the laser diode abuts the mark.

14. The laser/detector package of claim 12, wherein the mark is comprised of a metal pattern on the front surface of the sub-mount.

15. The laser/detector package of claim 12, wherein the mark is a partial cut of the front surface of the sub-mount.

16. The laser/detector package of claim 1, wherein the back surface of the spacer has a width approximately equal to a width of the front surface of the header post, the width of the front surface of the header post and the width of the back surface of the spacer being measured in a plane parallel with the reference surface.

17. The laser/detector package of claim 1, wherein the attachment plate is circular;

the reference surface of the attachment plate is substantially flat;

the front surface of the header post is substantially flat;

the top surface of the spacer is substantially flat;

the bottom surface of the spacer is substantially flat;

the front surface of the spacer is substantially flat; and the back surface of the spacer is substantially flat.

18. The laser/detector package of claim 1, wherein the spacer is rectangular.

19. The laser/detector package of claim 1, wherein the front surface of the sub-mount is substantially flat;

the back surface of the sub-mount is substantially flat; and the bottom surface of the sub-mount is substantially flat.

20. The laser/detector package of claim 1, wherein the sub-mount is rectangular.

21. The laser/detector package of claim 1, wherein the header post is configured to function as a heat sink.

22. A laser/detector package comprising:

an attachment plate having a reference surface;

a header post having a front surface that is perpendicular to the reference surface;

a sub-mount having a front surface, a bottom surface, and a back surface attached to the front surface of the header post such that the bottom surface of the sub-mount abuts the reference surface; and a laser diode attached to the front surface of the sub-mount;

wherein the sub-mount is sized to precisely position the laser diode a predetermined distance from the reference surface.

23. The laser/detector package of claim 22, wherein the sub-mount is comprised of silicon.

24. The laser/detector package of claim 22, wherein solder attaches the sub-mount to the header post.

25. The laser/detector package of claim 24, wherein the solder comprises lead and tin solder.

26. The laser/detector package of claim 22, wherein solder attaches the laser diode to the sub-mount.

27. The laser/detector package of claim 26, wherein the solder comprises gold and tin solder.

28. The laser/detector package of claim 22, wherein the front surface of the sub-mount has a mark that runs in a direction perpendicular to the reference surface, the mark facilitating positioning of the laser diode.

29. The laser/detector package of claim 28, wherein a center stripe on the laser diode is aligned with the mark.

30. The laser/detector package of claim 28, wherein the mark is a partial cut of the front surface of the sub-mount.

31. The laser/detector package of claim 28, wherein the mark is comprised of a metal pattern on the front surface of the sub-mount.

32. The laser/detector package of claim 28, wherein the front surface of the sub-mount has a mark that runs in a direction parallel to the reference surface, the mark facilitating positioning of the laser diode.

33. The laser/detector package of claim 32, wherein an edge of the laser diode abuts the mark.

34. The laser/detector package of claim 32, wherein the mark is comprised of a metal pattern on the front surface of the sub-mount.

35. The laser/detector package of claim 22, wherein the front surface of the sub-mount has a metal pattern that runs in a direction perpendicular to the reference surface, the metal pattern facilitating positioning of the laser diode.

36. The laser/detector package of claim 35, wherein the metal pattern is applied using a process of photolithography.

37. The laser/detector package of claim 35, wherein the mark is a partial cut of the front surface of the sub-mount.

38. The laser/detector package of claim 35, wherein a center stripe on the laser diode is aligned with the mark.

39. The laser/detector package of claim 22, wherein the back surface of the sub-mount has a width approximately equal to a width of the front surface of the header post, the width of the front surface of the header post and the width of the back surface of the sub-mount being measured in a plane parallel with the reference surface.

40. The laser/detector package of claim 22, wherein
   the attachment plate is circular;
   the reference surface of the attachment plate is substantially flat;
   the front surface of the header post is substantially flat;
   the front surface of the sub-mount is substantially flat;
   the back surface of the sub-mount is substantially flat; and
   the bottom surface of the sub-mount is substantially flat.

41. The laser/detector package of claim 22, wherein the sub-mount is rectangular.

42. The laser/detector package of claim 22, wherein the header post is configured to function as a heat sink.

43. A method of assembling a laser/detector package comprising:
   attaching a back surface of a spacer to a front surface of a header post positioned on reference surface of an attachment plate such that a bottom surface of the spacer abuts the reference surface;
   attaching a laser diode to a front surface of a sub-mount such that the laser diode emits laser beams in directions substantially parallel to the front surface of the sub-mount; and
   attaching a back surface of the sub-mount to the front surface of the header post such that a bottom surface of the sub-mount abuts a top surface of the spacer, wherein said spacer and sub-mount are configured to maintain a predefined distance between the laser diode and the reference surface.

44. The method of claim 43, further comprising:
   marking the front surface of the sub-mount such that the mark is substantially parallel with the reference surface when the sub-mount is attached to the header post; and
   positioning the laser diode on the sub-mount with reference to the mark.

45. The method of claim 44, wherein the positioning step includes positioning an edge of the laser diode so that it abuts the mark.

46. The method of claim 44, further comprising:
   subjecting the attachment plate, the spacer, the sub-mount, and the laser diode to a reflow process; and then
   repositioning the laser diode by reference to the mark on the sub-mount.

47. The method of claim 44, wherein the mark is a metal coating on the front surface of the sub-mount.

48. The method of claim 44, wherein the mark is a partial cut of the front surface of the sub-mount.

49. The method of claim 43, further comprising:
   marking the front surface of the spacer such that the mark is perpendicular to the reference surface when the spacer is attached to the header post; and
   positioning the sub-mount on the front surface of the header post with reference to the mark.

50. The method of claim 49, wherein reference to the mark includes aligning a line on the laser diode with the mark.

51. The method of claim 49, further comprising:
   subjecting the attachment plate, the spacer, the sub-mount, and the laser diode to a reflow process; and then
   repositioning the sub-mount by reference to the mark on the spacer.

52. The method of claim 49, wherein the marking step includes making a partial cut of the front surface of the spacer.

53. The method of claim 49, wherein the mark is comprised of a metal pattern on the front surface of the spacer.

54. A method of assembling a laser/detector package comprising:
   attaching a laser diode to a front surface of a sub-mount such that the laser diode emits laser beams in directions substantially parallel to the front surface of the sub-mount; and
   attaching a back surface of the sub-mount to a front surface of a header post positioned on a reference surface of an attachment plate such that a bottom surface of the sub-mount abuts the reference surface.

55. The method of claim 54, further comprising:
   marking the front surface of the sub-mount such that the mark is substantially parallel with the reference surface when the sub-mount is attached to the header post; and
   positioning the laser diode on the sub-mount with reference to the mark.

56. The method of claim 55, wherein the positioning step includes positioning an edge of the laser diode so that it abuts the mark.

57. The method of claim 55, wherein the mark is a metal coating on the front surface of the sub-mount.

58. The method of claim 55, wherein the mark is a partial cut of the front surface of the sub-mount.

59. The method of claim 54, further comprising:
   marking the front surface of the sub-mount such that the mark is perpendicular to the reference surface when the sub-mount is attached to the header post; and
   positioning the laser diode on the front surface of the header post with reference to the mark.

60. The method of claim 54, wherein reference to the mark includes aligning a line on the laser diode with the mark.

61. The method of claim 54, wherein the marking step includes making a partial cut of the front surface of the sub-mount.

62. The method of claim 54, wherein the mark is comprised of a metal pattern on the front surface of the sub-mount.

63. The method of claim 54, further comprising:
   subjecting the attachment plate, the sub-mount, and the laser diode to a reflow process; and then
   repositioning the laser diode by reference to a mark on the sub-mount.

* * * * *